(12) United States Patent
Mottola

(10) Patent No.: US 7,031,855 B2
(45) Date of Patent: Apr. 18, 2006

(54) CURRENT SENSE RESISTOR CIRCUIT WITH AVERAGING KELVIN SENSE FEATURES

(75) Inventor: Michael J. Mottola, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 10/870,589

(22) Filed: Jun. 17, 2004

(65) Prior Publication Data
US 2005/0283325 A1 Dec. 22, 2005

(51) Int. Cl.
*G01R 19/00* (2006.01)
*G01R 27/00* (2006.01)

(52) U.S. Cl. .......................... 702/64; 702/65
(58) Field of Classification Search ................ 702/57, 702/64, 65, 107, 117, 118
See application file for complete search history.

(56) References Cited

U.S. PATENT DOCUMENTS

| | | | |
|---|---|---|---|
| 5,345,170 A | 9/1994 | Schwindt et al. | |
| 6,329,778 B1 * | 12/2001 | Culp et al. ................. | 318/434 |
| 6,489,881 B1 | 12/2002 | Aleksandravicius et al. | |
| 6,710,317 B1 * | 3/2004 | Meadows ................... | 250/205 |
| 6,894,928 B1 * | 5/2005 | Owen ..................... | 365/185.14 |

* cited by examiner

*Primary Examiner*—Bryan Bui
(74) *Attorney, Agent, or Firm*—Ladas & Parry LLP

(57) ABSTRACT

A current sense resistor circuit using Kelvin connection sense features provides an average voltage across net sense resistance and average voltage across net reference resistance to be available at the Kelvin connection points. The Kelvin connections can be used by a negative feedback gain loop to hold the average current through respective reference elements and sense elements substantially constant.

9 Claims, 7 Drawing Sheets

Circuit 500.

US 7,031,855 B2

CURRENT SENSE RESISTOR CIRCUIT WITH AVERAGING KELVIN SENSE FEATURES

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO AN APPENDIX

Not applicable.

BACKGROUND

1. Technical Field

The technology described herein is generally related to the field of electrical circuits.

2. Description of Related Art

Electrical current sensing is used in a variety of applications. For example high current demand apparatus, such as motors, generally have control circuits which use current sensing to implement control signals back to the load. FIG. 1 (Prior Art) is an electrical schematic diagram of a conventional current sense circuit 100 for setting a voltage level to a predetermined value for such apparatus operations. For example, and referring to FIG. 1 (Prior Art), measuring a current is accomplished by forcing a current through a first, sense resistor "Rsense" and measuring the voltage "V" across the sense resistor, where $V_{MEASURED} = i_1 \cdot Rsense$. In control circuitry, to control the current "$i_1$" through the resistor Rsense, a feedback gain loop can be used to measure the voltage across the resistor and then adjust the current "Iset" so that the voltage is held at a predetermined value. An operational amplifier, "OP AMP," 101 is used to represent any negative feedback gain component(s) needed to force the electrical current Iset through the sense resistor Rsense connected in parallel with a reference resistor, "Rref," thereby forcing the same voltage drop across both resistors, Rsense, Rref. The second resistor Rref has a reference current "Iref" flowing through it. Thus, the sensed current is the value of "Iout":

$$Iout = (Rref \div Rsense) \times Iref.$$

The ratio of the sizes of the two resistors is known to be controllable in monolithic silicon processing. However, for large currents, Iout, the value of Rsense has to be relatively small so as to limit the voltage drop across Rsense; too large a voltage across Rsense often limits the working voltage of the system. Therefore, to make the value of Rsense low, Rsense has to be either made up of a physically large set of many parallel resistors as shown in FIG. 2 (Related Art) or has to be made with a material having inherent low resistance. If Rsense is made physically large such as shown in FIG. 2, the metal interconnects, depicted as "Rconnect," become quite resistive compared to the desired value of Rsense and it becomes difficult to define the actual electrical resistance of Rsense. If a low resistance material is employed, especially if low compared to interconnect lines to Rsense, the actual electrical resistance of Rsense again becomes difficult to define accurately. Another complication is that if Rref is made of the same low value resistance material in order to provide accurate matching, Rref then generally needs to be physically large.

In addition to dealing with these problematical complications, another aspect of this disclosure relates to "Kelvin connections." Kelvin connections are used compensate for voltage losses caused by line resistances which would otherwise cause errors in low voltage measurements. This is accomplished generally by providing a source line and a measurement line—also referred to commonly as "force line" and "sense line," respectively—to an interconnection point, known as the Kelvin connection, which is as close to a testing device as possible.

BRIEF SUMMARY

The present invention generally provides for a current sense resistor device having averaging Kelvin sense features.

The foregoing summary is not intended to be inclusive of all aspects, objects, advantages and features of the present invention nor should any limitation on the scope of the invention be implied therefrom. This Brief Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches.

Like reference designations represent like features throughout the drawings. The drawings in this specification should be understood as not being drawn to scale unless specifically annotated as such.

DETAILED DESCRIPTION

The present invention provides a method and apparatus for controls using current sensing. The present invention provides for sensing average voltage across a current sense resistor and a reference resistor using a Kelvin connection.

Sensing errors due to process gradients in the current sense resistor, temperature changes across the current sense resistor, and the additive affects of interconnect metal resistance are substantially eliminated.

Figure 3:
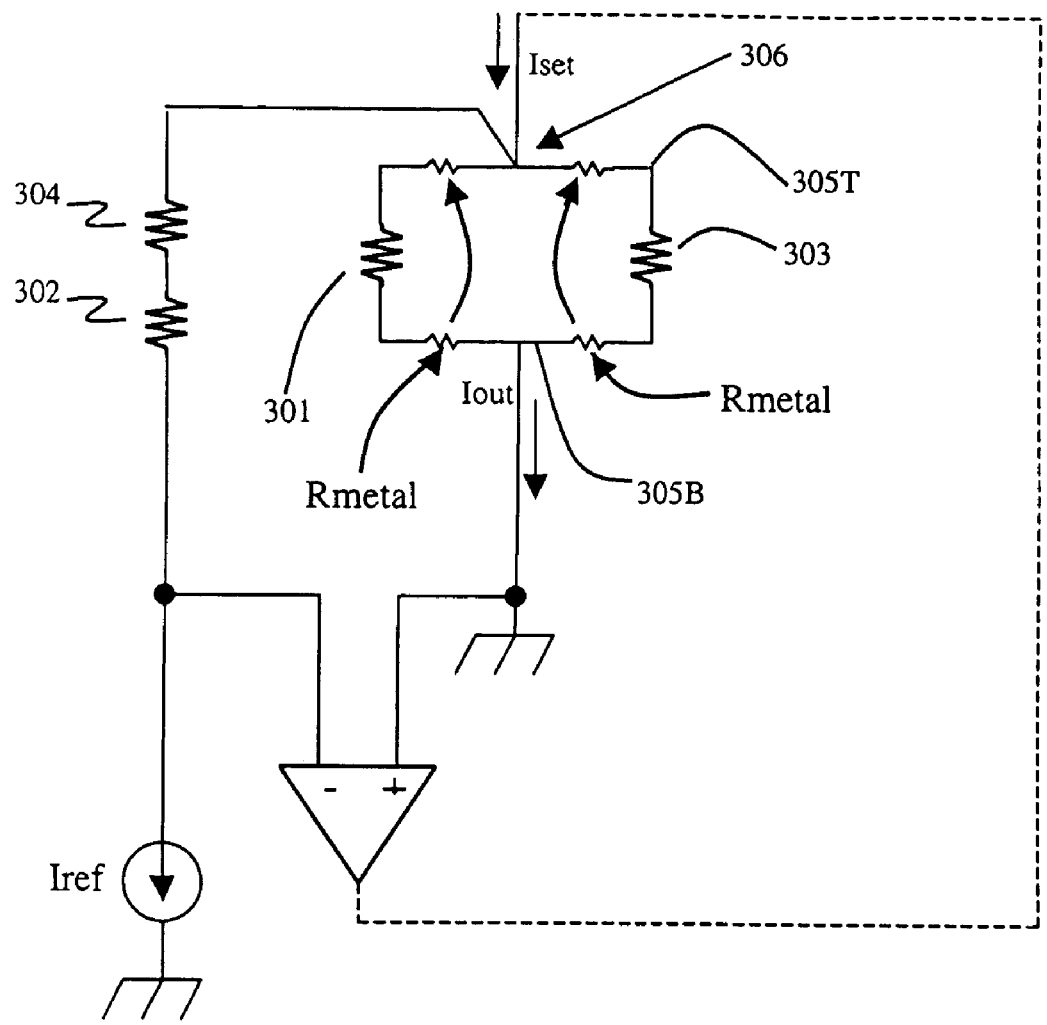
FIG. 3 in accordance with an exemplary embodiment of the present invention is an electrical diagram of a circuit unit for a current sense resistor layout using a local Kelvin sense node.

FIG. 3 is an electrical equivalent circuit diagram for an exemplary embodiment of the present invention. The design is implemented to provide a circuit unit 300 using a plurality of relatively physically small individual sense resistors 301, 303, connected in parallel, such that they may be arranged in close proximity to each other. It is intended by the inventor that the present invention may be implemented in integrated circuit (IC) chips where, as it is well known, it is desirable to pack many elements into microscopic regions of the chip. For best matching, it is preferred that the resistor units be substantially the same size.

Shown in this exemplary implementation are two, series-connected, reference resistors 302, 304, Rref. The preferred embodiment may have a ratio of "Rref/Rsense" of approximately 4:1 or greater. It will be recognized by those skilled in the art that for simplicity, this schematic diagram shows only two sense resistors 301, 303 and two reference resistors 302, 304, but, for a larger ratio of Ref/Rsense, more resistors may be added to these sets of the circuit unit 300; other exemplary embodiments are described hereinafter. A local Kelvin current sense connection node 306 is provided between the parallel sense resistors 301, 303, increasing the circuit's resistor-ratio accuracy.

The sense resistors 301, 303 have interconnects $305_{T(TOP)}$, $305_{B(BOTTOM)}$ (metal, ceramic, doped semiconductor material, or the like as would be known in the art), where "TOP" and "BOTTOM" serve only as a relative orientation with respect to the drawings for purpose of description of the present invention, each interconnect also having a resistance—artificially represented here by symbols labeled "Rmetal"—which does not add significantly to Rsense resistance because of the physically small size per sense resistor unit. For example, a ratio of Rref/Rsense again may be approximate 4:1. In other words, using physically relatively small sense resistors 301, 303, and relatively in close proximity to each other, the resistance, Rmetal, of the interconnects $305_{T,B}$ is much less than the net resistance of Rsense:

Rmetal<<Rsense.

It will be recognized by those skilled in the art that circuit unit 300 design allows the ratio Rref/Rsense to be accurately controlled wherein the interconnect resistance—net Rmetal—factor is negligible and can be ignored. Because of the resultant relatively small size of circuit unit 300, and by having resistors made with like material and having relatively same physical dimensions, this design greatly decrease error due to process gradients across Rsense, Rref, and temperature changes across Rsense, Rref and connection resistance, Rmetal.

Figure 1:
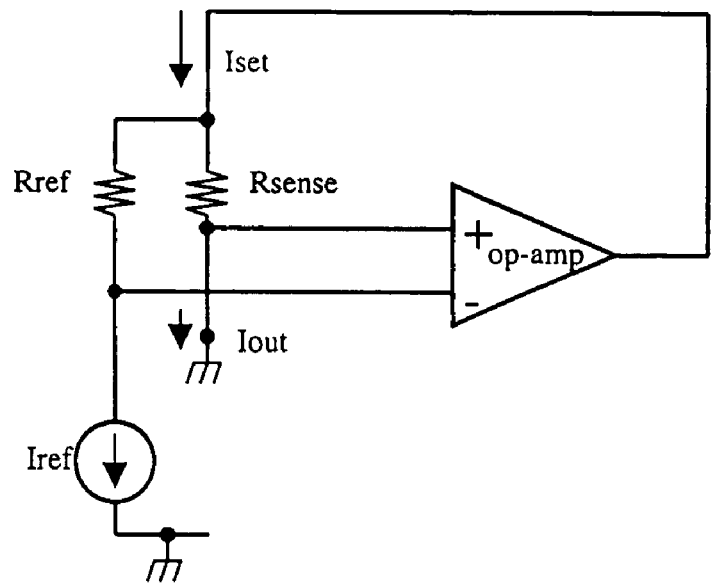
FIG. 1 (Prior Art) is an electrical circuit diagram of a conventional current sense circuit, setting the voltage to the predetermined value.
Figure 2:
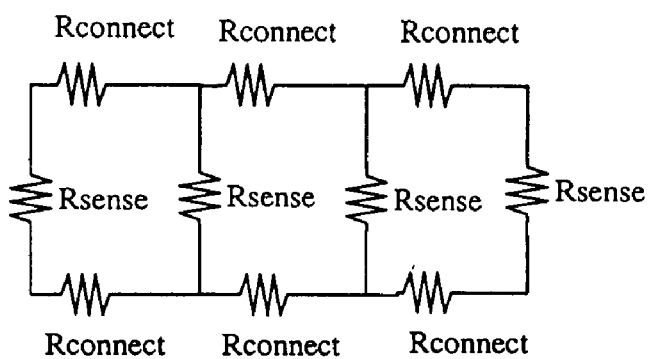
FIG. 2 (Related Art) is an electrical equivalence circuit diagram associated with FIG. 1 for illustrating problems associated with the prior art.

As with FIG. 1, OP AMP 101 and interconnection lines in FIG. 3 and subsequent FIGURES is representative of any negative feedback gain component(s) employed to force the voltage across reference resistors and sense resistors, thereby forcing the same voltage drop across both.

Figure 4:
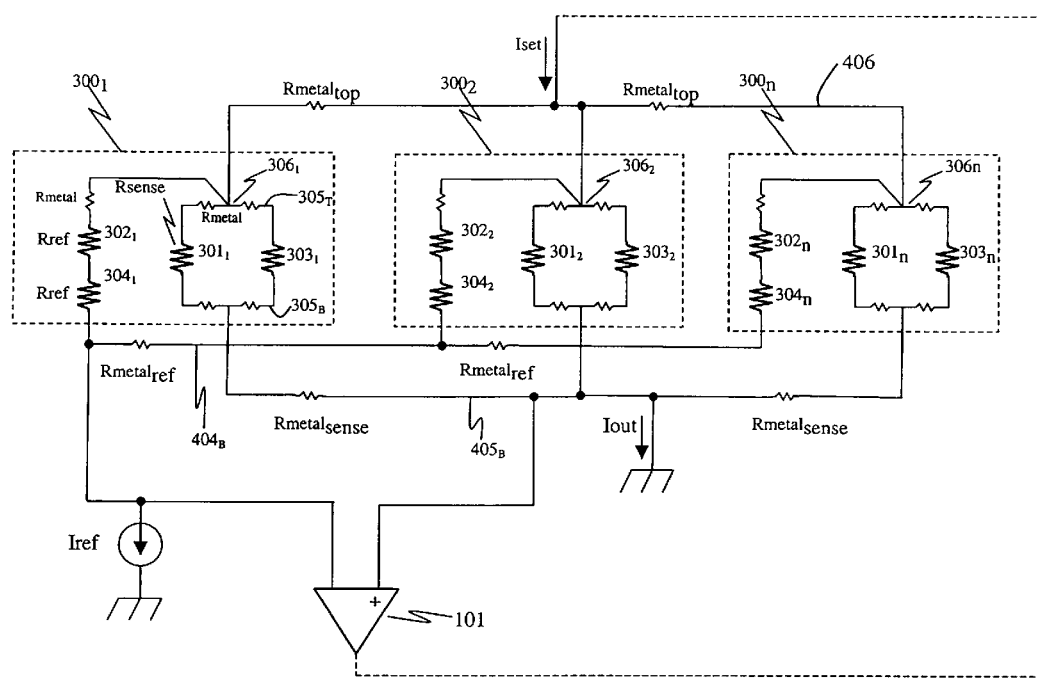
FIG. 4 illustrates a method for lowering current sense resistor net resistance value employing a plurality of circuit units as shown in FIG. 3.

FIG. 4 is an exemplary implementation generally combining, in parallel, a plurality of circuit units 300 as shown in FIG. 3. This circuit 400 implementation connects in parallel circuit units $300_1$, $300_2$ . . . $300_N$, thereby reducing the net Rsense and Rref resistance values, without changing the ratio Rref/Rsense (for simplification, when referring to all multiple elements shown with subscripts, a generic "ss" subscript is used, e.g. $300_{ss}$). In other words, having parallel circuit units $300_{ss}$ does not change the ratio Rref/Rsense.

Each circuit unit $300_{ss}$ is connected by an interconnect 406—having an effective resistance "$Rmetal_{TOP}$" between each unit—interconnecting all local Kelvin current sense nodes $306_{ss}$. Since Kelvin connections are used, the resistance $Rmetal_{TOP}$ between each unit has substantially no effect. Therefore, variation of the voltage at the sense nodes $306_{ss}$ will not cause the ratio Rref/Rsense currents to change.

Similarly, because of the relatively high resistance value of the reference resistors $302_{ss}$, $304_{ss}$ as compared to the Rmetal at the top of Ref and the top of Rsense, the current through $R302_{ss}$ and $R304_{ss}$ has negligible effect on the Kelvin voltage at node $306_{ss}$. However, in such a configuration, the resistance "$Rmetal_{sense}$" of the bottom interconnect metal $405_B$ may affect the voltage at local Kelvin sense nodes $306_{ss}$. In each circuit unit 300, because the top of Rref $302_{ss}$ and the top Rsense $301_{ss}$, $303_{ss}$, share the same Kelvin voltage, the ratio of currents in Rref and Rsense remain unchanged for each unit and, therefore, unchanged for an aggregate of multiple circuit units $300_{ss}$. Therefore, for an implementation can be achieved combining in parallel a plurality of circuit units $300_{ss}$ as shown in FIG. 4, in order to reduce the net Rsense resistance value.

Figure 5:
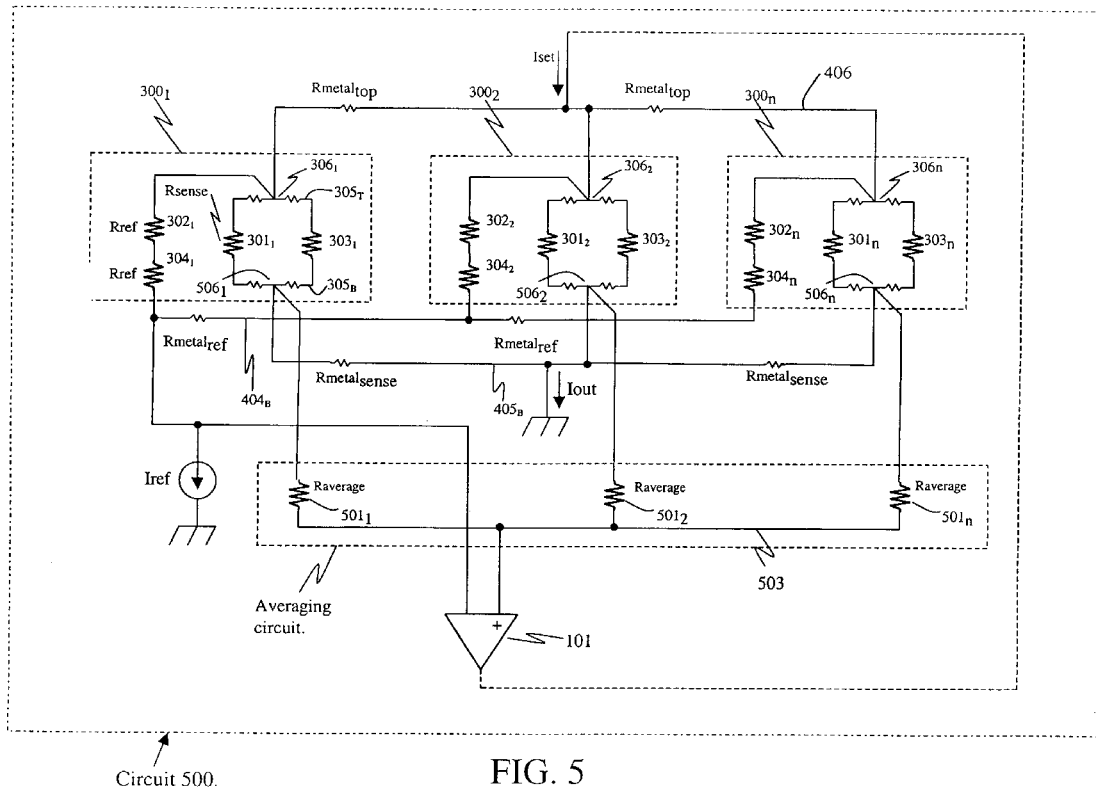
FIG. 5 is another exemplary embodiment of the present invention for the circuit as shown in FIG. 4.

FIG. 5 is a second exemplary embodiment of the present invention for the circuit as shown in FIG. 4. In this circuit 500, in order to negate the effect of voltage drops through the resistance "$Rmetal_{sense}$" and $Rmetal_{top}$, the bottom interconnect $405_B$ may be provided with a Kelvin sense connection node $506_{ss}$ to each circuit unit $300_{ss}$. Thus, although $Rmetal_{sense}$ and $Rmetal_{top}$ affect the top voltage at the first Kelvin connection node $306_{ss}$, both and $Rmetal_{ref}$ share the same Kelvin voltage at that node and so the net effect is negated. The bottom Kelvin sense connection $506_{ss}$ will hold a voltage in a negative feedback gain loop condition. An averaging network—here shown as a set of resistors, Raverage $501_1$, $501_2$, . . . . $501_n$, to which sense resistors $505_1$, $505_2$ . . . $505_N$ are connected via Kelvin sense connection nodes $506_1$, $506_2$, . . . $506_N$, respectively, at the $R_{average}$ resistors bottom interconnect 503—a voltage is provided that is the average at Kelvin sense point $501_{ss}$ such that, $$V503=(V501\text{-}1+V501\text{-}2+ \ldots V501\text{-}n)/n.$$

Again, the bottom Kelvin sense connection provides a connection point 503 for the negative feedback gain loop as described hereinbefore.

One example of an implementation of the components of FIG. 5 may be to have ten Rsense resistors of approximately one ohm each, Rref resistors approximately 1000 ohms each, and Raverage resistors about 200 ohms each.

Figure 6:
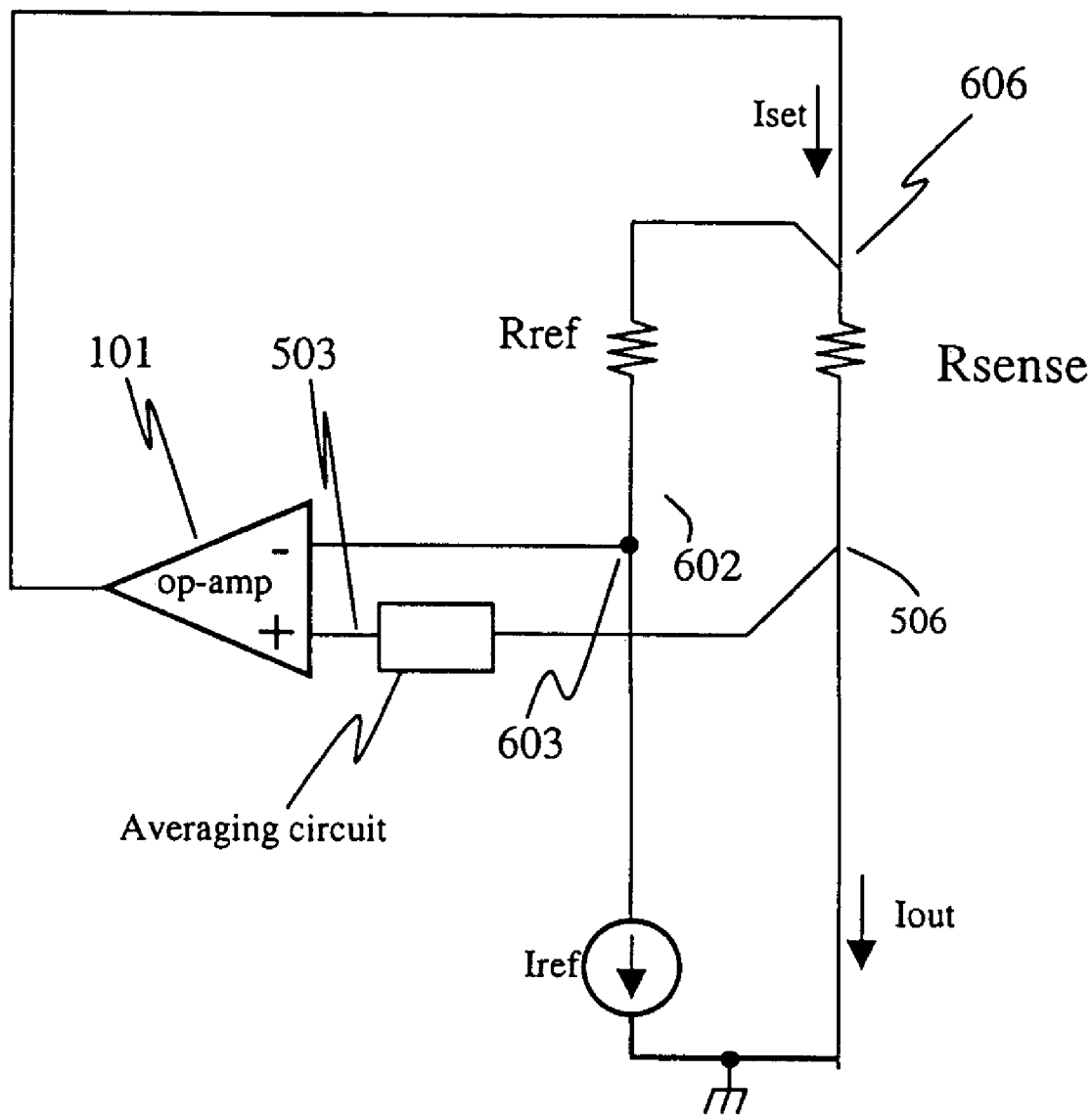
FIG. 6 is a circuit diagram illustrating a simplified schematic for the circuit as shown in FIG. 5.

FIG. 6 is a simplified representation for FIG. 5. Referring now to both FIG. 5 and FIG. 6, a representative sum of all parallel sets of reference resistors $302_{ss}$, $304_{ss}$ connected to each node $306_{ss}$ in FIG. 5 is illustrated as a single equivalent reference resistor, Rref 602. Similarly, a single node 606 is representative of all the nodes $306_{ss}$ in FIG. 5, again where the current through $R_{ref}$ is small enough that the $Rmetal_{ref}$ can be ignored. The voltage at node 603 in FIG. 6 is the same as the voltage at bottom interconnect 404b in FIG. 5. The voltage drop across Rref 602 is the product of: the sum of the currents in each Rref in FIG. 5, and, the ohmic value of Rref 602 in FIG. 6. The voltage at node 606 is the sum of the voltage drop across Rref 602 and the voltage at node 603. The voltage at node 501 in FIG. 6 is the average of the voltages at nodes $506_{ss}$ in FIG. 5. The OP AMP 101 in FIG. 6 is again illustrative of any gain component which forces the voltage at node 603 to be equal to the voltage at node 506. Therefore, given only first order variation of voltages at nodes $506_{ss}$ in FIG. 5, the current through Rref 602 and Rsense 601 in FIG. 6 hold the same ratio as: Rref/Rsense.

Figure 7:
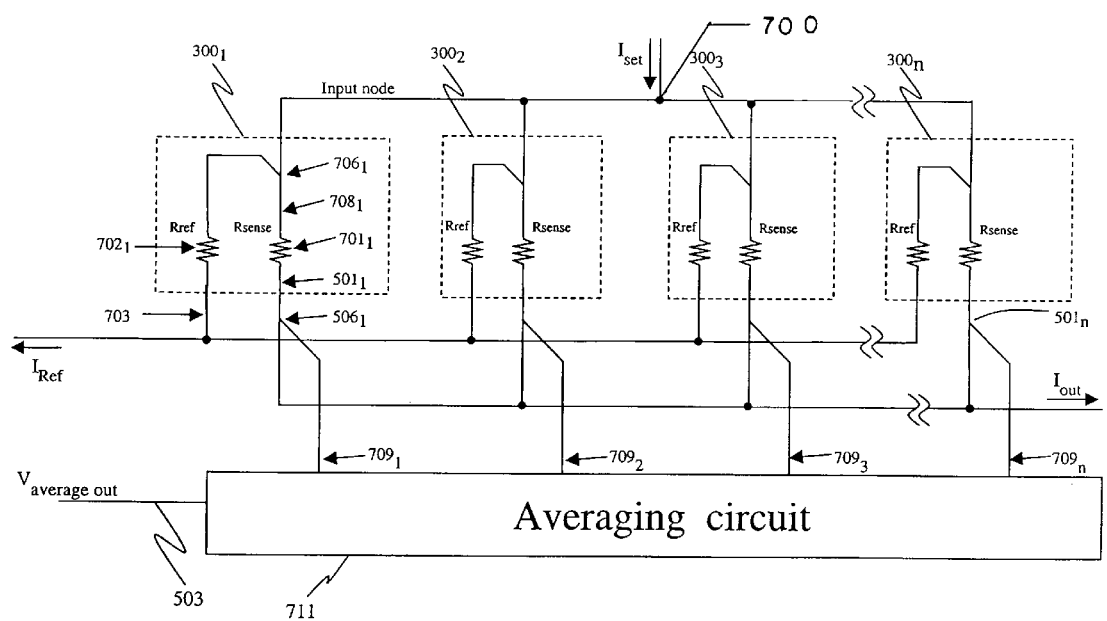
FIG. 7 is an illustration of a first fundamental aspect in accordance with the exemplary embodiment as shown in FIG. 6.

FIG. 7 is an illustration of a first fundamental aspect in accordance with the exemplary embodiment as shown in FIGS. 5 and 6. This embodiment shows an input node receiving current "Iset." Sense resistor subunits $701_{ss}$, having sense resistor input terminals $706_{ss}$ are connected to the input node and have an output terminal $501_{ss}$. In parallel with said sense resistor subunit $701_{ss}$, a reference resistor subunit $702_{ss}$, having an input terminal, connects to input terminal $706_{ss}$ and an output terminal $703_{ss}$. The reference resistor subunit $702_{ss}$ is connected to said sense resistor input terminal at node $706_{ss}$ by a Kelvin connection. Via another Kelvin connection to node $501_{ss}$ and "averaging circuit" 711 is provided such that the average of the voltage at each node $501_{ss}$ is the voltage for node 503, FIG. 5. The voltage at node 503 and at terminal $703_{ss}$ provide connection points for the negative feedback loop as described hereinbefore.

Figure 8:
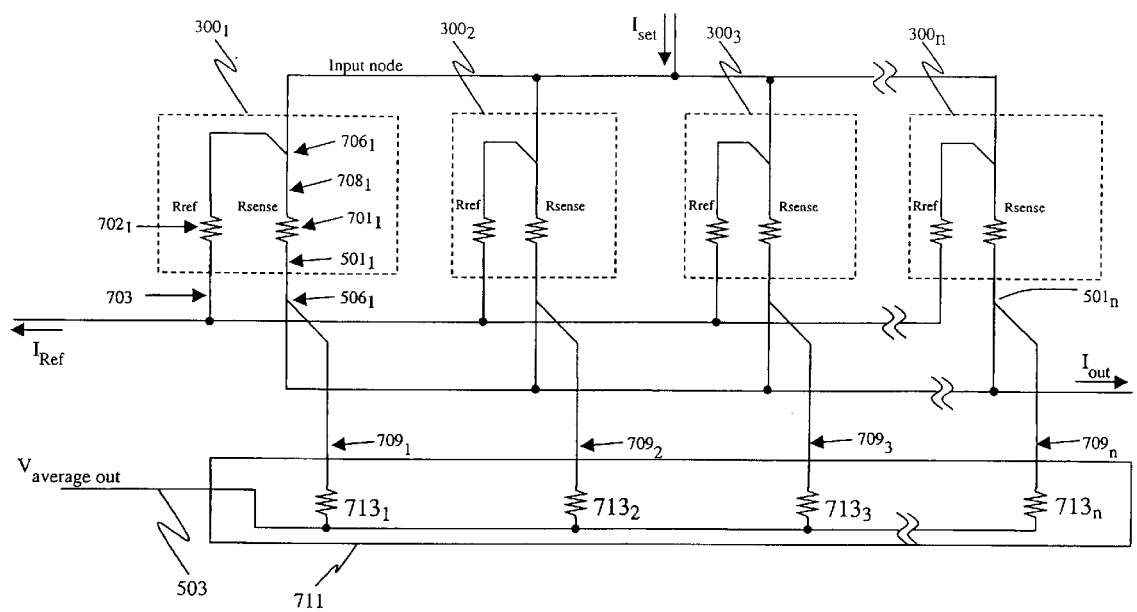
FIG. 8 is an illustration of a second fundamental aspect in accordance with the exemplary embodiment as shown in FIG. 7.

FIG. 8 is an illustration of a second fundamental aspect in accordance with the exemplary embodiment as shown in FIGS. 5, 6, and 7. The Averaging circuit is shown to further comprise a plurality of averaging resistors $713_{ss}$.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A current sense circuit device comprising:
    an input node;
    a sense resistor subunit having a sense resistor input terminal connected to said input node and having a sense resistor output terminal;
    connected to the input node and said sense resistor subunit, a reference resistor subunit, wherein said reference resistor subunit has an input terminal connected to said input node and sense resistor input terminal via a first Kelvin connection, and said sense resistor output terminal has a second Kelvin connection; and
    connected to said second Kelvin connection, an averaging circuit, having a plurality of input terminals and an output terminal such that voltage at said averaging circuit output terminal is a voltage which is an average of voltages at all said averaging circuit input terminals and such that said reference resistor output terminal and said averaging circuit output terminal provide respective connections for a negative feedback gain loop.

2. The device as set forth in claim 1, the averaging circuit further comprising:
    connected to said each second Kelvin connection of each of said sets, a resistor-based voltage averaging network.

3. The device as set forth in claim 1, said sense resistor subunit comprising:
    a set of parallel-connected resistors providing a first net resistance and a set of series-connected reference resistors providing a second net resistance.

4. The device as set forth in claim 2 wherein said second Kelvin connection connects to the averaging circuit.

5. The device as set forth in claim 3 where net resistance ratio of said first net resistance to said second net resistance is at least approximately 4:1.

6. A current sense resistor circuit with a negative gain feedback loop amplifier, said amplifier having an amplifier first input terminal and an amplifier second input terminal, the circuit comprising:
    said amplifier first input terminal is connected for receiving a given electrical current;
    electrically connected to said amplifier first input terminal, a plurality of parallel sense resistors, each having an input terminal Kelvin connection and an output terminal Kelvin connection;
    electrically connected to said input terminal Kelvin connection, a reference resistor means for establishing a reference current therethrough and having a reference resistor means output terminal connection; and
    an averaging circuit having an averaging circuit input terminal connected to said output terminal Kelvin connection and an averaging circuit output terminal connected to said amplifier first input terminal, wherein a first voltage at said output terminal Kelvin connection is provided to said averaging circuit input terminal and a second voltage at said reference resistor means output terminal connection is provided to said amplifier second input terminal.

7. The circuit as set forth in claim 6 further comprising:
    connected to each output Kelvin connection, a resistor averaging means for taking an average of all the voltages at said output Kelvin connection.

8. In a control apparatus using electrical current sensing, an electrical current sense subunit comprising:
    an input node for receiving a given electrical current to be sensed for said control apparatus;
    connected to said input node, a plurality of sense resistors, each of said sense resistors having an input terminal and an output terminal, said sense resistors being connected in parallel and each of said sense resistors having a substantially equal size wherein connection metal therebetween does not substantially add to net resistance thereof;
    connected to said sense resistors via a Kelvin connection to said input terminal side of each of said sense resistors, at least one reference resistor wherein net resistance ratio of said reference resistors to said sense resistors is at least approximately 4:1; and connected to said output terminal of said sense resistors, an averaging circuit such that use of average voltage across sense resistors and said reference resistor provides a reduced-error averaging Kelvin sense potential.

9. A current sense circuit with averaging Kelvin sense elements, the circuit comprising:

sensing resistor means for receiving an input current;

connected via a first Kelvin input connection to said sensing resistor means, referencing resistor means for receiving said input current;

connected via a first Kelvin output connection to said sensing resistor means, means for providing an average voltage signal; and an operational amplifier means for providing a negative gain feedback loop for said current sense circuit, having a first operational amplifier input connected to said referencing resistor means and a second operational amplifier input connected to said means for providing an average voltage signal.

* * * * *